(12) United States Patent
Polcyn (10) Patent No.: US 8,461,447 B2
(45) Date of Patent: Jun. 11, 2013

(54) DEVICE FOR USE IN A FURNACE EXHAUST STREAM FOR THERMOELECTRIC GENERATION

(75) Inventor: Adam D. Polcyn, Pittsburgh, PA (US)

(73) Assignee: PPG Industries Ondo, Inc, Cleveland, OH (US)

(*) Notice: Subject to any disclaimer, the term of this patent is extended or adjusted under 35 U.S.C. 154(b) by 1516 days.

(21) Appl. No.: 11/958,565

(22) Filed: Dec. 18, 2007

(65) Prior Publication Data

US 2013/0098418 A1    Apr. 25, 2013

(51) Int. Cl.
*H01L 31/052* (2006.01)

(52) U.S. Cl.
USPC .......................................... 136/205

(58) Field of Classification Search
USPC ........................ 110/184; 454/1–47
See application file for complete search history.

(56) References Cited

U.S. PATENT DOCUMENTS

| | | | |
|---|---|---|---|
| 3,240,628 A | | 3/1966 | Sonntag, Jr. |
| 3,377,206 A | * | 4/1968 | Hanlein et al. ............... 136/212 |
| 3,428,496 A | * | 2/1969 | Lockwood ................... 136/208 |
| 3,833,428 A | | 9/1974 | Snyder et al. |
| 3,941,576 A | | 3/1976 | Welton, Jr. |
| 3,981,292 A | | 9/1976 | Lilly et al. |
| 4,045,197 A | | 8/1977 | Tsai et al. |
| 4,256,173 A | | 3/1981 | Tsai et al. |
| 4,282,023 A | | 8/1981 | Hammel et al. |
| 4,290,797 A | | 9/1981 | Rossi |
| 4,298,370 A | | 11/1981 | Hammel |
| 4,319,904 A | | 3/1982 | Gullett |
| 4,380,463 A | | 4/1983 | Matesa |
| 6,273,186 B1 | | 8/2001 | Ognibene et al. |
| 6,538,193 B1 | | 3/2003 | Fraas |
| 7,856,949 B2 | | 12/2010 | Polcyn |
| 2009/0205711 A1 | | 8/2009 | Polcyn |

FOREIGN PATENT DOCUMENTS

| | | |
|---|---|---|
| GB | 874660 | 8/1961 |
| JP | 2003 338641 A | 11/2003 |

OTHER PUBLICATIONS

Elert, Glenn. The Physics Hypertextbook. http://physics.info/expansion/ 1998-2012.*
McKinstry, Herbert A. "Thermal expansion of clay minerals" The American Minerologist, vol. 50, Jan.-Feb. 1965, pp. 212-222.*
International Search Report, PCT/US2008/079938, dated Jan. 15, 2010.
Polcyn, Adam D., U.S. Appl. No. 12/031,303, entitled "Use of Photovoltaics for Waste Heat Recovery," filed Feb. 14, 2008.
Polcyn, Adam D., U.S. Appl. No. 11/958,574, entitled "Heat Pipes and Use of Heat Pipes in Furnace Exhaust" filed Dec. 18, 2007.

* cited by examiner

*Primary Examiner* — Jennifer Michener
*Assistant Examiner* — Magali P Slawski
(74) *Attorney, Agent, or Firm* — Andrew C. Siminerio (57) ABSTRACT

A device for generating voltage or electrical current includes an inner elongated member mounted in an outer elongated member, and a plurality of thermoelectric modules mounted in the space between the inner and the outer members. The outer and/or inner elongated members each include a plurality of passages to move a temperature altering medium through the members so that the device can be used in high temperature environments, e.g. the exhaust system of an oxygen fired glass melting furnace. The modules are designed to include a biasing member and/or other arrangements to compensate for differences in thermal expansion between the first and the second members. In this manner, the modules remain in contact with the first and second members. The voltage generated by the modules can be used to power electrical loads.

20 Claims, 8 Drawing Sheets

DEVICE FOR USE IN A FURNACE EXHAUST STREAM FOR THERMOELECTRIC GENERATION

NOTICE OF GOVERNMENT SUPPORT

This invention was made with Government support under Contract No. DE-FC36-04GO14044 awarded by the Department of Energy. The United States government may have certain rights in this invention.

RELATED PATENT APPLICATION

This application is related to U.S. patent application Ser. No. 11/958,574 filed even date in the name of Adam D. Polcyn and titled "HEAT PIPES AND USE OF HEAT PIPES IN FURNACE EXHAUST", now U.S. Pat. No. 7,856,949.

BACKGROUND OF THE INVENTION

1. Field of the Invention

This invention relates to a device for use in a furnace exhaust system for thermoelectric generation, and more particularly, to a device having thermoelectric modules mounted between a pair of temperature controlled members, the device can be mounted in the exhaust stream of a furnace, e.g. a furnace for melting glass-batch materials whereby the thermoelectric modules generate a voltage.

2. Discussion of the Presently Available Technology

Devices used for thermal generation of electricity can include one or more thermoelectric modules mounted between a pair of members. The thermoelectric modules respond to the temperature differential between the members by generating a voltage. The greater the temperature difference between the members, the greater the voltage and power generated.

In one arrangement, the device includes the thermoelectric modules between an outer member and an inner member with the outer member maintained at a lower temperature than the inner member. One such device is a Global Thermoelectric cylinder TEG (model 7120) having a hot face which is a cylinder having a 3.5 inch diameter and a cold face which is a cylinder of larger diameter having a water cooled jacket over the cold face. The outer member is at a lower temperature than the inner member to take advantage of the thermal expansion of the inner member to maintain surface contact between the thermoelectric modules and the members. More particularly and is appreciated by those skilled in the art, the thermoelectric modules to operate efficiently are maintained in surface contact with the outer surface of the inner member and the inner surface of the outer member. In most applications, the temperature difference between the members is the result of heating only one member. When the member heated is the inner member, the inner member expands moving toward the outer member and moving the thermoelectric modules toward the inner surface of the outer member. On the other hand, if the outer member is heated, the outer member expands moving away from the inner member and the thermoelectric modules.

In the instance when heated exhaust streams can be flowed through narrow passageways or openings, e.g. a passageway through the center portion of the inner member, the presently available technology is acceptable. However, where there is a large volume of exhaust gas, or there is low pressure/low flow of exhaust gas, and/or the exhaust gas has particles, the presently available thermoelectric generating devices have limitations. More particularly, the particles in the exhaust gas can accumulate in the passageway of the inner member and stop or reduce the flow of exhaust gas through the passageway. Reducing the flow of the exhaust gas through the exhaust system of the furnace to move the exhaust gas through the passageway of the inner member of the thermoelectric generating device can have an adverse effect on the process and/or furnace components. For example but not limiting to the discussion, altering or interrupting the flow of the exhaust stream through the exhaust system of a furnace for melting glass batch materials can result in over heating sections of the refractories of the furnace. Exhaust gas having low pressure/low flow of reduces the flow of the heated exhaust gas through the passageway of the inner member, thus reducing the electric output of the thermoelectric device.

As can be appreciated by those skilled in the art, it would be advantageous to provide a device for thermoelectric generation that can be heated by the exhaust of a furnace, e.g. but not limited to, the exhaust of a furnace for melting glass batch materials and does not have the limitations of the presently available devices.

SUMMARY OF THE INVENTION

This invention relates to a thermoelectric module. In one non-limiting embodiment of the invention, the thermoelectric module includes, among other things, a first plate; a second plate; a thermoelectric cell between the first and the second plates wherein the thermoelectric cell generates a voltage when there is a temperature difference between the first plate and the second plate. The first plate and the second plate have at least one of the following relationships:
   the co-efficient of thermal expansion of the first plate and the second plate are different, and
   the thickness of the first plate and the second plate are different.

In another non-limiting embodiment of the invention, the thermoelectric module includes, among other things, a first plate; a second plate; a thermoelectric cell between the first and the second plates wherein the thermoelectric cell generates a voltage when there is a temperature difference between the first plate and the second plate, and a biasing member acting on at least one of the first and second plates to move the at least one plate away from the thermoelectric cell.

Further, the invention relates to a device for thermoelectric generation. In one non-limiting embodiment of the invention, the device includes, among other things, a first elongated member mounted within a hollow second elongated member to provide a compartment between outer surface of the first elongated member and inner surface of the second member. At least one thermoelectric module is mounted in the compartment and in contact with the outer surface of the first elongated member and the inner surface of the second member. A passageway is provided in the first elongated member to move a temperature altering medium through the first elongated member to alter the temperature of the first elongated member.

In another non-limiting embodiment of the invention, the device for thermoelectric generation includes, among other things, a first elongated member mounted within a hollow second elongated member. The second elongated member includes a first conduit having a first end, an opposite second end, an outer surface and an inner surface; a second conduit mounted in the first conduit, the second conduit having a first end, an opposite second end, an outer surface in facing relationship to the inner surface of the first conduit and an inner surface in facing relationship to outer surface of the first elongated member to provide a compartment between outer surface of the first elongated member and inner surface of the second conduit. A pair of spacers is between the inner surface of the first conduit and the outer surface of the second conduit to provide a first passageway and a second passageway. Each of the first and second passageways extend from the first end of the first and second conduits toward the second end of the first and second conduits, and the first and the second passageways are interconnected at the second end of the second conduit to move a temperature altering medium from the first passageway to the second passageway. At least one thermoelectric module is mounted in the compartment and in contact with the outer surface of the first elongated member and the inner surface of the second conduit of the second elongated member.

Still further, the invention relates to a furnace having a device for thermoelectric generation. The furnace includes, among other things, a heating chamber, and a flue for moving heated exhaust gases from the heating chamber wherein the device is mounted in the flue to be heated by the exhaust gases moving over the device. The device includes, among other things, a first elongated member mounted within a hollow second elongated member to provide a compartment between outer surface of the first elongated member and inner surface of the second member, wherein the exhaust gas moves around outer surface of the second member. At least one thermoelectric module is mounted in the compartment and is in contact with the outer surface of the first elongated member and the inner surface of the second member. A passageway in at least one of the first and second elongated members is provided to move a temperature altering medium through the at least one of the first and second elongated members to alter the temperature of the at least one of the first and second elongated members.

In addition the invention relates to generating a voltage by, among other things, positioning a thermoelectric device in exhaust flue of a furnace, the thermoelectric device having an outer surface and an internal passageway with at least one thermoelectric module between the outer surface and the internal passageway, wherein a voltage is generated when the temperature of the outer surface is higher than the temperature of the passageway; passing a heated medium over the outer surface of the thermoelectric device, and passing a cooling medium through the passageway to maintain the temperature of the passageway lower than the temperature of the outer surface of the thermoelectric device to generate a voltage.

DESCRIPTION OF THE INVENTION

As used herein, spatial or directional terms, such as "inner", "outer", "left", "right", "up", "down", "horizontal", "vertical", and the like, relate to the invention as it is shown in the drawing figures. However, it is to be understood that the invention can assume various alternative orientations and, accordingly, such terms are not to be considered as limiting. Further, all numbers expressing dimensions, physical characteristics, and so forth, used in the specification and claims are to be understood as being modified in all instances by the term "about". Accordingly, unless indicated to the contrary, the numerical values set forth in the following specification and claims can vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 6.7, or 3.2 to 8.1, or 5.5 to 10. Also, as used herein, the terms "mounted over", "positioned over", or "provided over" mean mounted, positioned, or provided on but not necessarily in surface contact with. For example, one article "provided over" another article does not preclude the presence of materials of between the articles.

Before discussing several non-limiting embodiments of the invention, it is understood that the invention is not limited in its application to the details of the particular non-limiting embodiments shown and discussed herein since the invention is capable of other embodiments. Further, the terminology used herein to discuss the invention is for the purpose of description and is not of limitation. Still further, unless indicated otherwise, in the following discussion like numbers refer to like elements.

In the following discussion, non-limiting embodiments of the invention are discussed for use with a furnace for melting glass batch materials and/or homogenizing molten glass, however, as will be appreciated, the invention is not limited thereto, and it is understood that while furnaces for heating particular materials are being described as illustrative examples, the invention is not limited thereto and can be used on any type of furnace to heat any type of material, e.g. but not limited to, a glass forming chamber of the type used in the art to make float glass; furnaces for refining ores to metals; furnaces for changing physical properties of materials, e.g. but not limited to annealing glass and metals; furnaces for making plastics, and furnaces for burning any type of materials, e.g. but not limited to wood, coal and gas.

Figure 1:
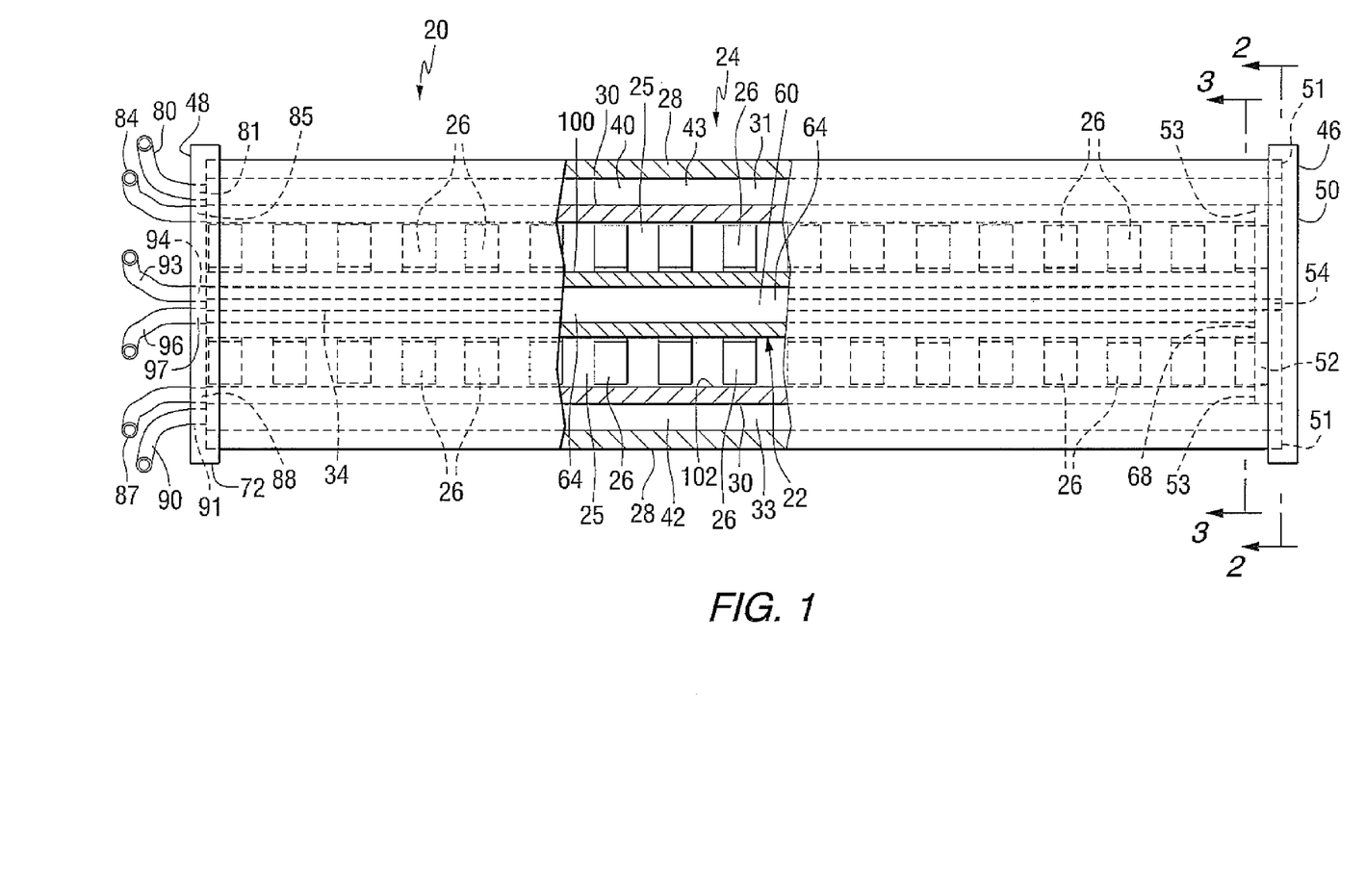
FIG. 1 is an elevated side view having portions removed for purposes of clarity of a non-limiting embodiment of a device of the invention for thermoelectric generation in accordance to the teachings of the invention.

With reference to FIG. 1, there is shown a device 20 incorporating features of the invention; the device 20 is mounted in an arrangement of a furnace (to be discussed below) for moving heated gases to and/or away from the heating chamber of the furnace, e.g. the exhaust system of a regenerative furnace and/or an oxygen fired furnace, and/or a fuel input system of a regenerative furnace, in accordance to the teachings of the invention to generate a voltage or electricity. The device 20 includes an inner elongated member 22 mounted within and spaced from an outer elongated hollow member 24 to provide a compartment 25 between the members 22 and 24. A plurality of thermoelectric modules 26 are mounted in the compartment 25 in a manner discussed below. The outer elongated hollow member 24 includes an outer first wall or conduit 28, and an inner second wall or conduit 30 spaced from the outer first wall 28 by four elongated spacers 31-34 (see FIGS. 2-4). The spacers 31-34 are securely mounted between the first wall 28 and the second wall 30 of the elongated member 24 to provide four chambers or passages 40-43 for moving a heating or cooling medium between the outer first wall 28 and the inner second wall 30 of the second member 24.

The device 20 has an end 46 and an opposite end 48. The end 46 of the device 20 has an outer or first end cap 50 secured to end 51 of the outer first wall 28 of the outer member 24, and an inner or second end cap 52 (see FIGS. 1 and 2) secured to end 53 of the inner second wall 30 of the outer member 24, with the first end cap 50 and the second end cap 52 spaced from one another as shown in FIG. 1. A baffle 54 is mounted between the end caps 50 and 52 to isolate the chambers 40 and 43 from the chambers 41 and 42 to provide a first chamber 56 to interconnect the chambers 40 and 43, and a second chamber 58 interconnecting the chambers 41 and 42. In this manner a temperature altering medium at a desired temperature, e.g. a cooling fluid, e.g. cold water or gas, or a heating fluid, e.g. hot water or hot gas can be moved from the end 48 of the device 20 through the chamber 40 or 43, into the first interconnecting chamber 56, into and through the chamber 43 or 40, respectively, to the end 48 of the device 20, and a temperature altering medium can be moved from the end 48 of the device 20 through the chamber 41 or 42, into the second interconnecting chamber 58, into and through the chamber 42 or 41, respectively, to the end 48 of the device 20, to heat or cool the outer member 24 of the device 20.

With reference to FIGS. 1-4 as needed, the inner elongated member 22 can be a solid member or can be an inner elongated hollow member having a baffle 60 extending from the end 48 of the device 20 and terminating short of the second end cap 52 to provide the inner member 22 with a pair of chambers or passages 64 and 66 that interconnect with one another by having end 68 of the baffle 60 spaced from the second end cap 52. In this manner, a temperature altering medium at a desired temperature can be moved from the end 48 of the device 20, through one of the chambers, e.g. the chamber 64 of the inner member 22 toward the second cap 52, around the end 68 of the baffle 60 into the other one of the chambers, e.g. the chamber 66 of the inner member 22 toward the end 48 of the device 20. As can now be appreciated, the design of this embodiment of the invention provides for altering the temperature of the inner member 22 of the device 20.

Figure 4:
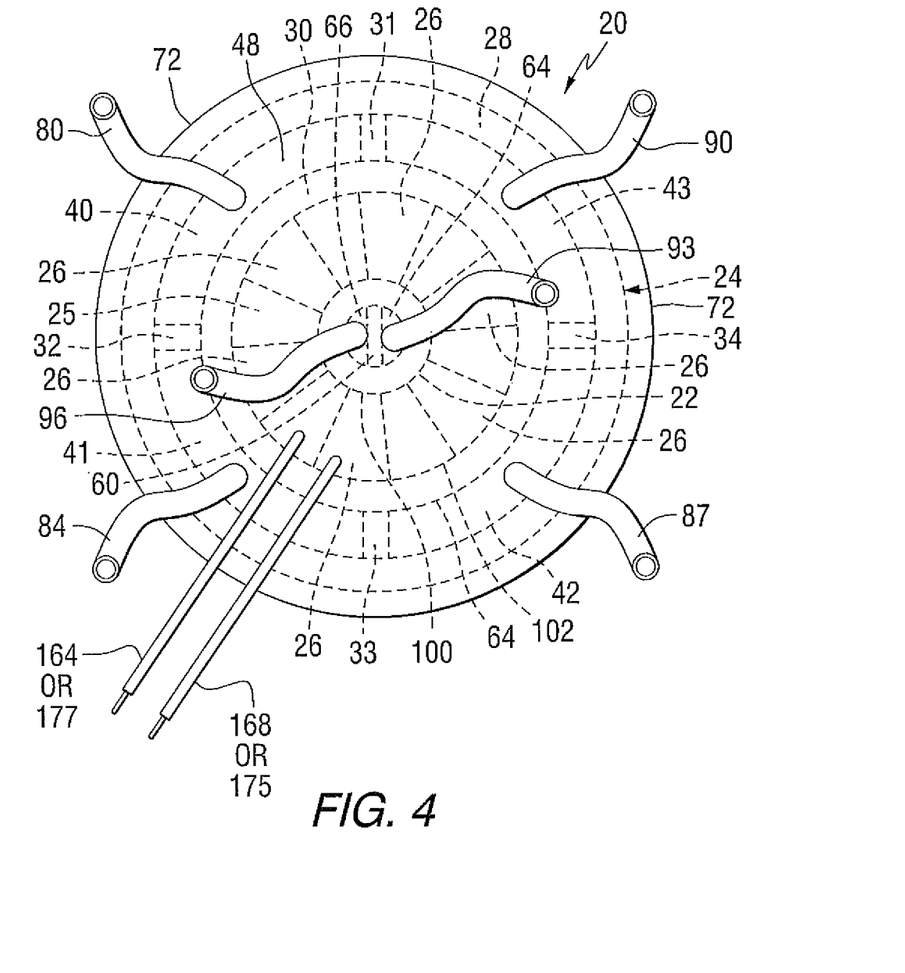
FIG. 4 is an end view of the device shown in FIG. 1.

The temperature altering medium can be moved through the chambers 40-43 of the outer member 24, and the chambers 64 and 66 of the inner member 22 in any convenient manner. With reference to FIGS. 1 and 4, and not limiting to the invention, the device 20 is provided with an end cap 72 having a first conduit 80 connected to the chamber 40 of the outer member 24 by passageway 81 in the cap 72; a second conduit 84 connected to the chamber 41 of the outer member by passageway 85 in the cap 72; a third conduit 87 connected to the chamber 42 of the outer member 24 by passageway 88 in the cap 72; a fourth conduit 90 connected to the chamber 43 of the outer member 24 by passageway 91 in the cap 72; a fifth conduit 93 connected to the inlet chamber 64 of the inner member 22 by passageway 94 in the cap 72, and a sixth conduit 96 connected to the outlet chamber 66 of the inner member 22 by passageway 97 in the cap 72. In accordance to the discussion above, the medium is moved into the device 20 though the conduits 80, 87 and 93, and the medium is moved out of the device 20 though the conduits 84, 90 and 96.

In a non-limiting embodiment of the invention, a cooling medium, e.g. but not limited to chilled water, is flowed through the chambers 64 and 66 of the inner member 22, and/or through the chambers 40-43 of the outer member 24 to maintain a temperature differential between the inner member 22 and the outer member 24 of the device 20 to energize the thermoelectric modules 26, and to prevent thermal deterioration of the inner member 22, the outer member 24 and/or the thermoelectric modules 26. In the preferred practice of the invention, the outer member 24 of the device 20 is heated and the inner member 22 of the device 20 is maintained at a temperature below the temperature of the outer member in any convenient manner. In one non-limiting embodiment of the invention, a cooling fluid, e.g. but not limited to chilled water is moved through the chambers 64 and 66 respectively of the inner member 22 as discussed above. In another non-limiting embodiment of the invention, the outer member 24 is heated, and a cooling fluid is moved through the chambers 40-43 to prevent thermal damage to the outer member 24 and/or the thermoelectric modules 26. In still another non-limiting embodiment of the invention, the outer member 24 is heated, and a cooling fluid is moved through the chambers 40-43 and the chambers 64 and 66 to prevent thermal damage to the inner member 22, the outer member 24 and/or the thermoelectric modules 26. As is appreciated, the greater the temperature difference between the outer member 24 and the inner member 22, the greater the voltage output of the thermoelectric modules 26.

In the practice of one non-limiting embodiment of the invention, the end 46 of the device 20 (see FIG. 1) is inserted through a furnace wall into the heated exhaust gas and/or the heated input gas of the furnace, and the end 48 (see FIGS. 1 and 4) of the device 20 is outside of the furnace wall. The invention is not limited to the length of the device 20 as measured between the ends 46 and 48 that is inserted into the furnace; however, as can be appreciated, the longer the length of the device inserted into the furnace, the increased number of thermoelectric modules 26 that can be activated by the heated exhaust and/or the heated input gasses of the furnace.

The invention is not limited to the location in which the device 20 of the invention can be positioned in a furnace. As is appreciated by those skilled in the art, depending on the location of the device 20 in the exhaust system of the furnace, the device can be exposed to high or low temperatures. Therefore, and not limiting to the invention, when the device 20 of the invention is placed in a high temperature area of a furnace, a cooling medium is preferably, but not limiting to the invention, moved through the chambers 40-43 of the outer member 24 and the chambers 64 and 66 of the inner member 22 (see FIG. 3). When the device 20 of the invention is placed in a medium temperature area of the furnace, a cooling medium is preferably, but not limiting to the invention, only moved through the chambers 40-43 of the outer member 24. When the device 20 of the invention is placed in a low temperature area of the furnace, no medium is preferably, but not limiting to the invention, moved through the chambers 40-43 of the outer member 24, and the chambers 64 and 66 of the inner member 22, or optionally a cooling medium is moved through the chambers 64 and 66 of the inner member 22 to increase the temperature difference between the inner and the outer members 22 and 24, respectively.

In the preferred practice of the invention, but not limited thereto, the maximum temperature the device of the invention is exposed is the temperature below the temperature at which the inner member 22 and the outer member 24 is structurally stable, and/or the deterioration temperature of the thermoelectric modules which ever is lower. For a full appreciation of the invention, the following will discuss two temperature conditions that should be considered to prevent thermal damage to the device 20. The first temperature condition is the maximum temperature the portion of the device in the furnace will reach without cooling the portion of the device in the heating system, e.g. not moving a cooling medium through the chambers 40-43, 64 and 66 of the device 20. The maximum temperature of the first temperature condition is the lower temperature of (1) the temperature at which the thermoelectric modules after continuous exposure for one hour to such temperature are non-functional, (2) the temperature at which the inner member 22 after continuous exposure for one hour bends under the force of gravity, and (3) the temperature at which the outer member 24 after continuous exposure for one hour bends under the force of gravity. The second temperature condition is the maximum temperature the portion of the device in the furnace will reach moving cooling medium through the chambers of the device 20. The maximum temperature of the second temperature condition is the lower temperature of (1) the temperature at which the thermoelectric modules after continuous exposure for one hour to such temperature are non-functional, (2) the temperature at which the inner member 22 after continuous exposure for one hour bends under the force of gravity, and (3) the temperature at which the outer member 24 after continuous exposure for one hour bends under the force of gravity. It is expected that the device 20 will reach thermal equilibrium after one hour in a heated environment. As can be appreciated, the invention is not limited to the one hour time period, and the time period can be longer or shorter than one hour depending on the heated environment.

The invention is not limited to the material and/or the dimensions of the inner member 22 and the outer member 24 of the device 20. In one non-limiting embodiment of the invention, the inner member 22 and the outer member 24 of the device 20 are made of 316 stainless steel tubing having a wall thickness of ⅛ inch (0.32 centimeter). Further the invention is not limited to the cross sectional configuration of the inner member 22 and the outer member 24, e.g. the cross sectional configuration of the inner member and/or the outer member can have a circular configuration; a polygonal configuration having three or more sides; an elliptical configuration, and combinations thereof. In one non-limiting embodiment of the invention, the inner and the outer members 22 and 24, respectively, have a circular cross sectional configuration with the axis of the inner and outer members coincident.

Figure 2:
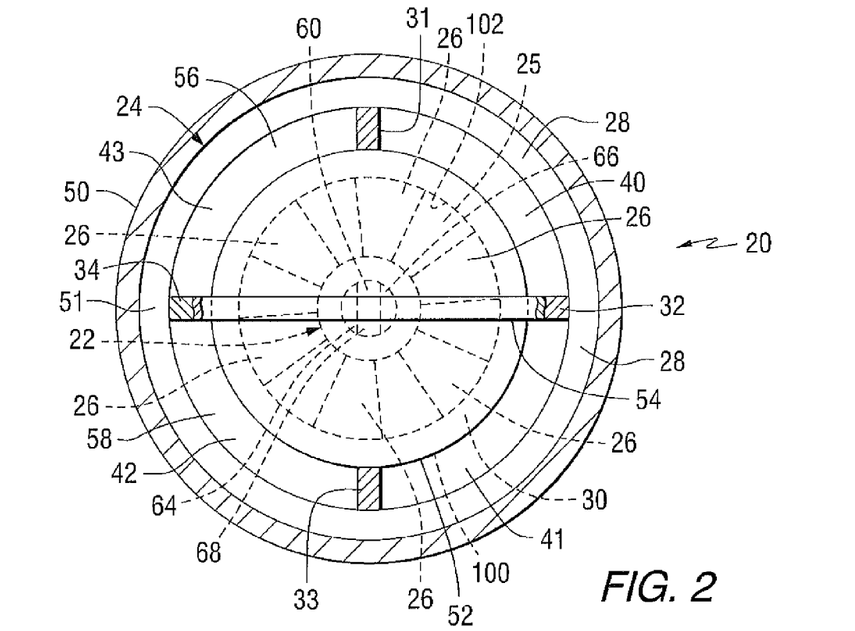
FIG. 2 is a view taken along line 2-2 of FIG. 1.
Figure 3:
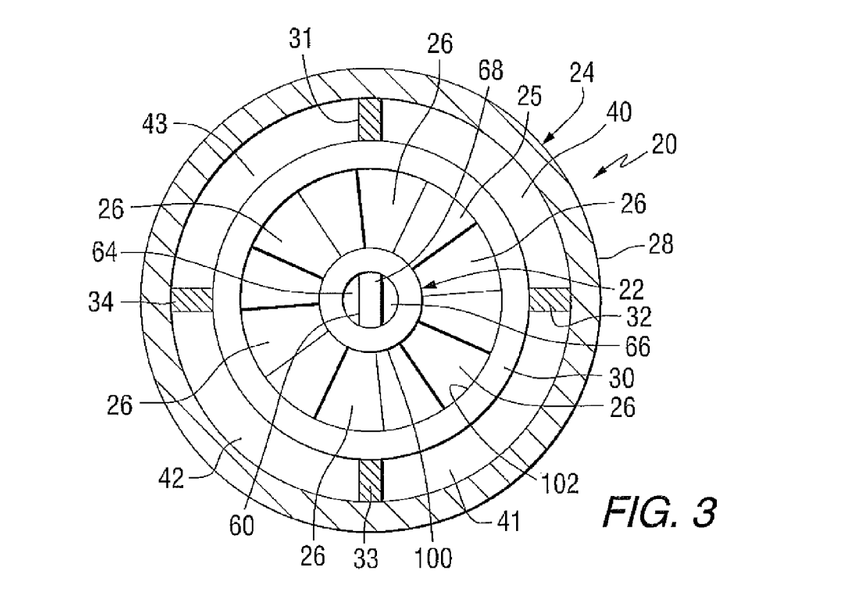
FIG. 3 is a view taken along line 3-3 of FIG. 1.

The discussion is directed to the thermoelectric modules 26 mounted in the compartment 25 between outer surface 100 of the inner member 22 and inner surface 102 of the inner second wall or conduit 30 of the outer member 24 (see FIGS. 1-3). As can be appreciated, the invention is not limited to the type of thermoelectric modules used in the practice of the invention, and any of the types of thermoelectric modules that generate voltage when a temperature differential is applied to the thermoelectric modules can be used in the practice of the invention.

Figure 5:
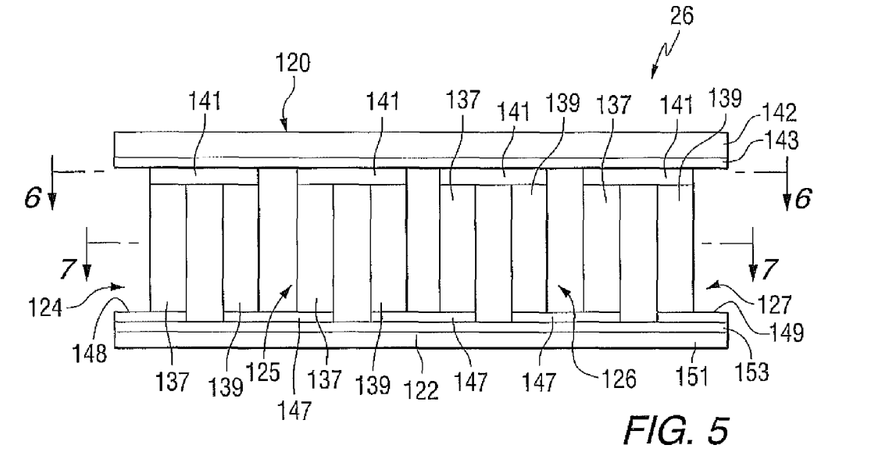
FIG. 5 is an elevated side view of a thermoelectric module that can be used in the practice of the invention.
Figure 6:
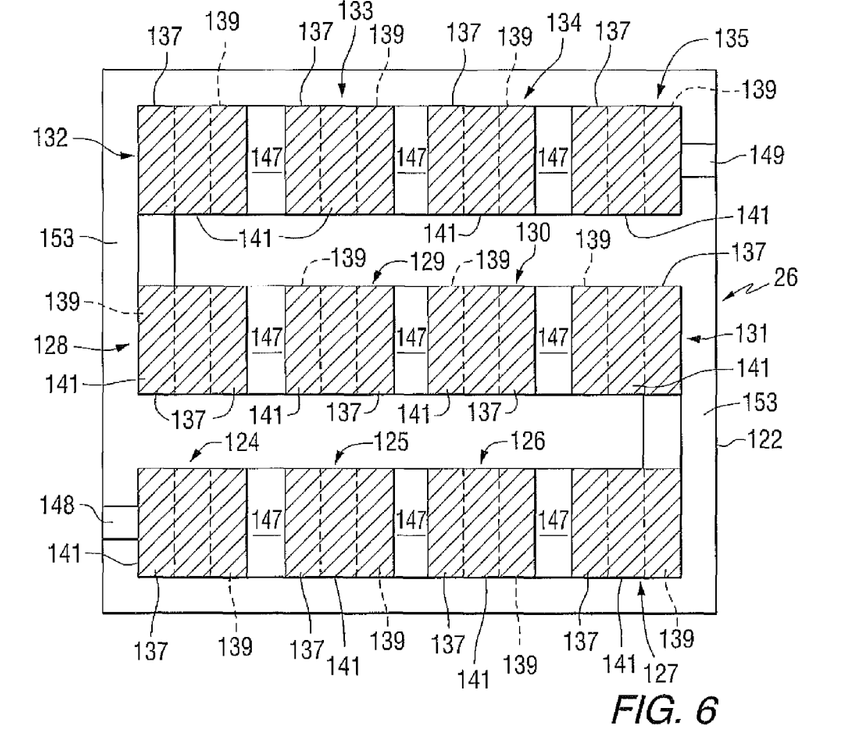
FIG. 6 is a view taken along line 6-6 of FIG. 5.
Figure 7:
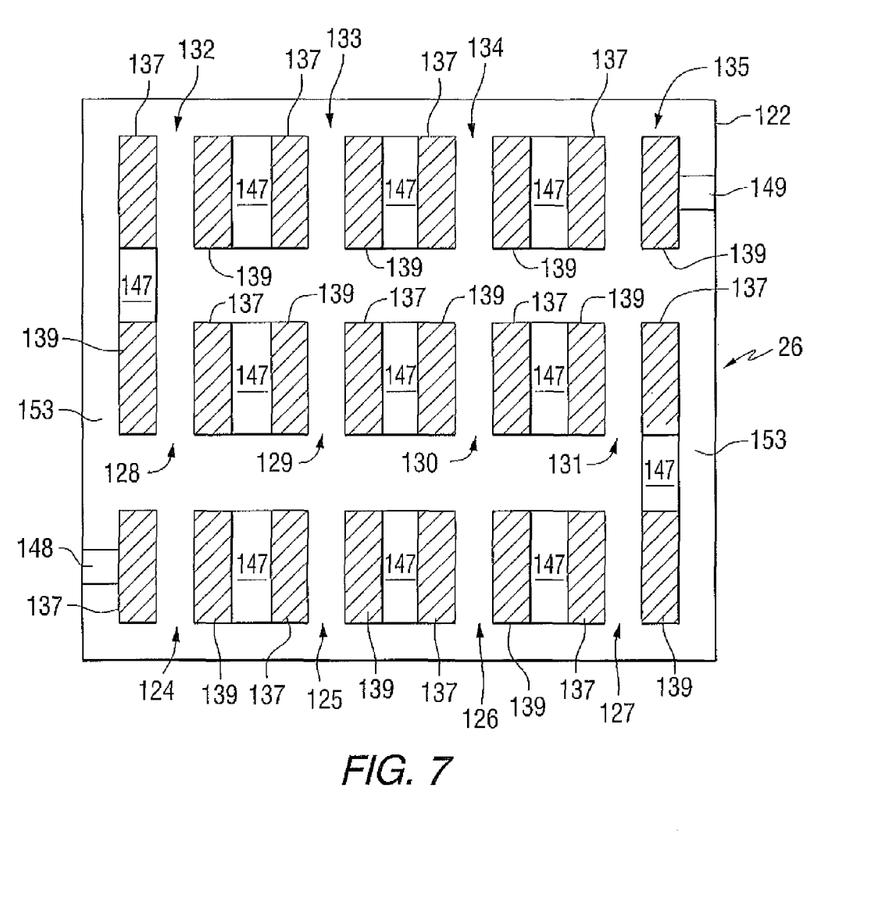
FIG. 7 is a view taken along line 7-7 of FIG. 5.

With reference to FIGS. 5-7 as needed, the thermoelectric module 26 includes a pair of plates 120 and 122 having a plurality of cells or thermoelectric cells 124-135 between the plates. Each cell includes an N type semiconductor material or thermoelectric material 137 and a P type semiconductor material or thermoelectric material 139 joined at one side or end by an electrically conductive connector 141 (see FIGS. 5 and 6). Thermoelectric materials or semiconductor materials that can be used in the practice of the invention include, but are not limited to, N and P type lead telluride (PbTe); N and P type bismuth telluride ($Bi_2Te_3$); silicon (Si) and germanium (Ge) doped with boron for P type or doped with phosphorous for N type, and TAGS (($AgSbTe_2)_{1-x}(GeTe)_x$), to name a few. Thermoelectric cells and thermoelectric materials or semiconductor materials are well known in the art and no further discussion is deemed necessary.

In the practice of the invention, the plate 120 conducts heat from the outer elongated member 24 to the cells 124-135, and electrically isolates the cells 124-135 contacting the plate 120 from one another. Materials that can be used for the plate 120 include heat conductive electrically insulating plastics. The invention also contemplates making the plate 120 from a metal substrate 142 and an electrically insulating plastic layer 143 between the metal substrate 142 and the cells 124-135 (clearly shown in FIG. 5).

The plate 122, in the practice of the invention, electrically isolates the N type thermoelectric material 137 and the P type thermoelectric material 139 of the same cell (see FIGS. 5 and 7) from one another; electrically connects the N type thermoelectric material of one cell to the P type thermoelectric material of another cell, e.g. but not limited to the P type thermoelectric material of an adjacent cell, and conducts heat from the cells 124-135 to the inner elongated member 22. Materials that can be used for the plate 122 include thermally conductive electrically insulating plastics having discrete areas 147 (see FIG. 7) of an electrically conductive film to selective connect the N type thermoelectric material 137 of one cell, e.g. the cell 128 (see FIG. 7) to the P type thermoelectric material 139 of the adjacent cell 129. With this arrangement the cells or thermoelectric cells 124-135 are connected in series. In another non-limiting embodiment of the invention, the plate 122 includes a metal plate 151 and an electrically insulating plastic layer 153 having the discrete conductive areas 147. As can be appreciated, the cells or thermoelectric cells 124-135 can be connected in parallel by electrically connecting the P type thermoelectric material 139 of each cell together, and the N type thermoelectric material 137 of each cell together, in any convenient manner, e.g. by the electrically conductive area similar to the areas 147. To provide external electrical access to the cells, the N type thermoelectric material 137 of one of the cells, e.g. the cell 124 in this discussion is connected to an electrically conductive pad 148, and the P type thermoelectric material 139 of the cell 135 is connected to an electrically conductive pad 149.

As can be appreciated, the invention is not limited to the number of cells in the modules 26 and the manner of connecting the doped semiconductors of the cells. In one non-limiting embodiment of the invention, the electrically conductive areas 147 are areas of copper on a plastic substrate of the type used in printed circuit boards. Types of thermoelectric modules that can be used in the practice of the invention, but not limited thereto, are of the type sold by Global Thermal Electric and Marlowe Industries a Division of II-VI incorporated, 375 Saxonburg Blvd, Saxonburg, Pa. 16056.

As discussed above, the outer member 24 of the device 20 is exposed to the heated exhaust and/or heated input air of the furnace. In one non-limiting embodiment of the invention, the plate 120 (see FIG. 5) of the thermoelectric module 26 is in surface contact with the inner surface 102 of the outer member 24, and the plate 122 is in surface contact with the outer surface 100 of the inner member 22. Optionally, the plate 122 can be in surface contact with the outer member 24, and the plate 120 of the thermoelectric module 118 can be surface contact with the inner member 22.

Figures 8, 9:
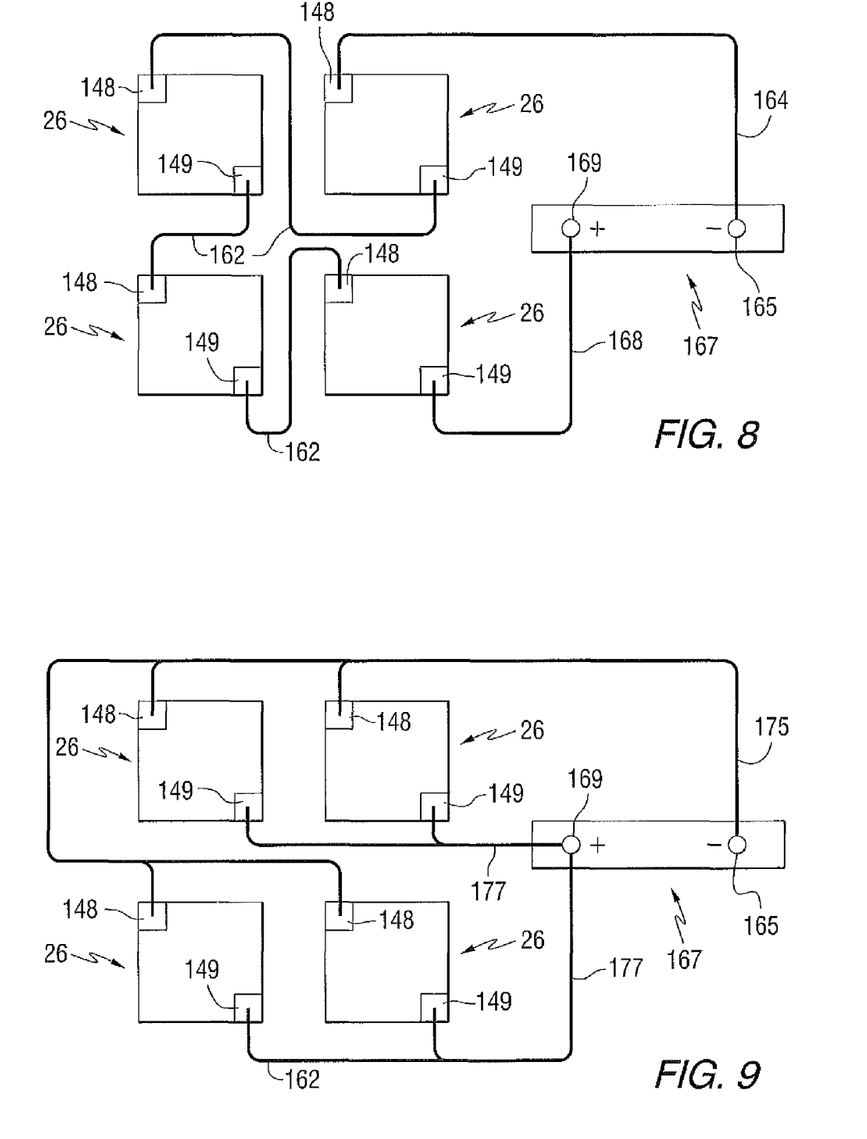
FIG. 8 is a diagram showing the thermoelectric modules used in the practice of the invention connected in series to an electrical load.
FIG. 9 is a diagram showing the thermoelectric modules used in the practice of the invention connected in parallel to an electrical load.

With reference to FIG. 8, in one non-limiting embodiment of the invention, the pad 149 of the thermoelectric modules 26 is connected by an electrical conductor or wire 162 to the pad 148 of adjacent one of the modules 26 to electrically connect the modules 26 in series. The pad 148 of the first one of the modules 26 connected in series is connected by electrical conductor 164 to negative terminal 165 of an electrical load 167, e.g. lights, and the pad 149 of the last one of the modules connected in series is connected by electrical conductor 168 to positive terminal 169 of the electric load 167. The invention also contemplates connecting the thermoelectric modules 26 in parallel as shown in FIG. 9, i.e. electrical conductor 175 electrically connects the pads 148 of the modules 26 to the negative terminal 165 of the load 167, and the electrical conductor 177 electrically connects the pads 149 of the thermoelectric modules 26 to the positive terminal 169 of the load 167. The electrical conductor or wires 164 and 168 or 175 and 177, extend out of the end cap 72 as shown only in FIG. 4 to provide external electrical access to the modules 26 in the device 20.

In the preferred practice of the invention, but not limiting thereto, the outer member 24 is exposed to the heated exhaust gas and/or heated input air of the furnace. In one non-limiting embodiment of the invention, the materials of the members 22 and 24 are selected such that the inner member 22 and the outer member 24 have a low coefficient of thermal expansion to minimize the expansion of the compartment 25 between the outer member 24 and the inner member 22 when the device 20 is heated so that the plates 120 and 122 of the thermoelectric modules 26 remain in contact with their respective one of the outer member 24 and the inner member 22 of the device 20. In another non-limiting embodiment of the invention, the outer member 24 has a coefficient of thermal expansion less than the coefficient of thermal expansion of the inner member 22, e.g. the inner member 24 is made of stainless steel and the inner member 22 is made of aluminum. With this arrangement, maintaining the inner member 22 to a first temperature and the outer member 24 to a higher second temperature, the inner member 22 increases in overall dimension to a value greater than if the inner member was of the same material as the outer member. As can now be appreciated, controlling the temperature of the inner member 22 relative to the outer member 24, and selecting materials for the inner member and the outer member having different thermal coefficient of expansion, the expansion of the compartment 25 between the inner member 22 and the outer member 24 can be controlled. In this manner, the modules 25 can be maintained in surface contact with the inner member 22 and the outer member 24.

Figure 10:
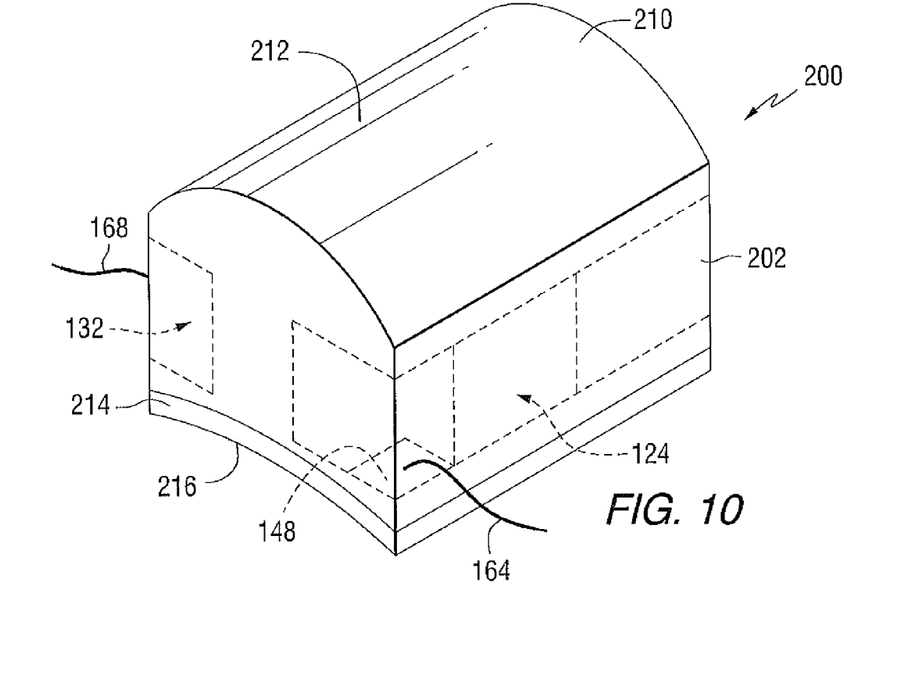
FIG. 10 is an orthogonal view of a non-limiting embodiment of a thermoelectric module of the invention.

With reference to FIG. 10 there is shown still another non-limiting embodiment of a thermoelectric module designated by the number 200 that can be used in the practice of the invention. The module 200 includes a body 202 housing the cells 124-135 (see FIGS. 5-7); only the cells 124 and 132 are shown in FIG. 10 for reference. The electrical conductor 164 is connected to the pad 148, and the electrical conductor 168 connected to the pad 149 to provide external electrical access to the cells 124-135 (the pads 148 and 149 are clearly shown in FIGS. 6 and 7). Surface 210 of plate 212 designated to contact the surface 102 of the inner second wall or conduit 30 of the outer member 24 has a convex shape, and surface 214 of plate 216 designated to contact the outer surface 100 of the inner member 22 has a concave shape. The plate 212 is thicker than the plate 216 so that the plate 212 will expand more than the plate 216 to maintain the surface 210 of the plate 212 in surface contact with the inner surface 102 of the outer member 24, and the surface 214 of the plate 216 in surface contact with the outer surface 100 of the inner member 22.

The thickness difference between the plates 212 and 216 is not limiting to the invention. In determining the thickness difference between the plates 212 and 216, the parameters to consider are the difference between the temperature of the inner surface 102 of the outer member 24 and the outer surface 100 of the inner member 22, and the coefficient of thermal expansion of the plates 212 and 218. More particularly, as the difference between the temperature of the inner surface 102 of the outer member 24 and the temperature of the outer surface 100 of the inner member 22 increases while the remaining parameters are kept constant, the thickness of the plate 212 should be increased, and vise versa. Increasing the coefficient of thermal expansion of the plate 212 contacting the outer member 24 while the remaining parameters are kept constant, the thickness of the plate 212 should be decreased and vise versa. Increasing the coefficient of thermal expansion of the plate 218 contacting the inner member 22 while the remaining parameters are kept constant, the thickness of the plate 216 can be decreased and vise versa.

As can be appreciated, the thickness increase of the plates 212 and 216 due to thermal expansion should not exceed the increase in the distance between the inner surface 102 of the outer member 24 and the outer surface 100 of the inner member 22 due to thermal expansion by more than 25%, preferably not more than 10% and most preferably not more than 5% to avoid crushing and damaging the modules. Further, as can be appreciated, the plate 212 contacting the inner surface 102 of the outer member 24 can have a thickness less than the thickness of the plate 216 contacting the outer surface 100 of the inner member 22.

Figure 11:
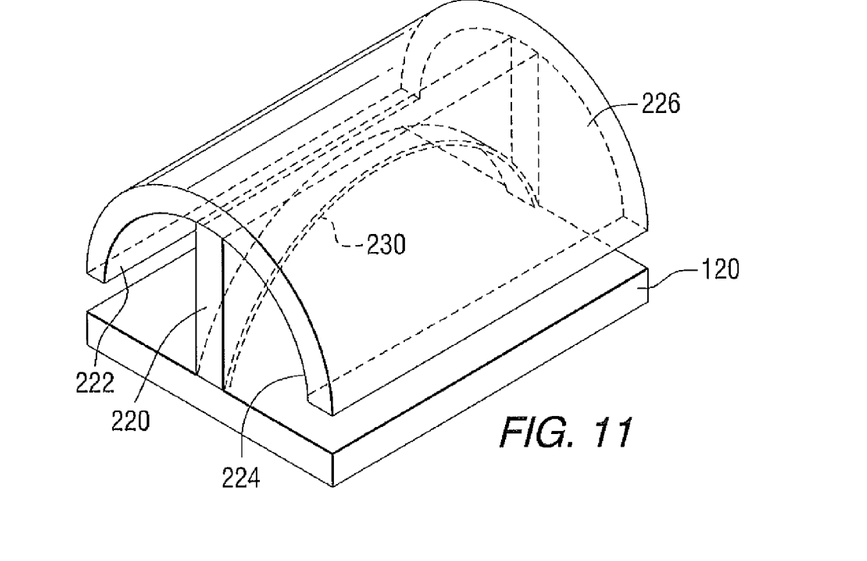
FIG. 11 is an orthogonal view of a non-limiting embodiment of an end, e.g. a top end or a bottom end of a thermoelectric module of the invention.

With reference to FIG. 11, in another non-limiting embodiment of the invention, a biasing member 220 is connected to a heat conducting shaped engaging member 222 to bias the member 22 against the inner surface 102 of the outer member 24, or against the outer surface 100 of the inner member 22. The biasing member 220 is mounted to the concave surface 224 of the engaging member 222 and to the plate 120 of the thermo electric module 26. As the outer member 24 of the device 20 is heated, the distance between the inner surface 102 of the outer member 24 and the outer surface 100 of the inner member 22 increases. The biasing member 220 expands to maintain convex surface 226 of the shaped member 222 against the inner surface 102 of the outer member 24 and the opposite surface of the module against the inner surface 100 of the inner member 22. The invention is not limited to the type of biasing member 220 used to move the shaped member 226 away from the plate 120. Types of biasing members that can be used in the practice of the invention, but not limited thereto are coiled metal springs, leaf springs, and spring biased telescoping posts. In one non-liming embodiment of the invention, the biasing member 220 is a telescoping member having a leaf spring 230 to bias the member 220 away from the plate 120.

Figure 12:
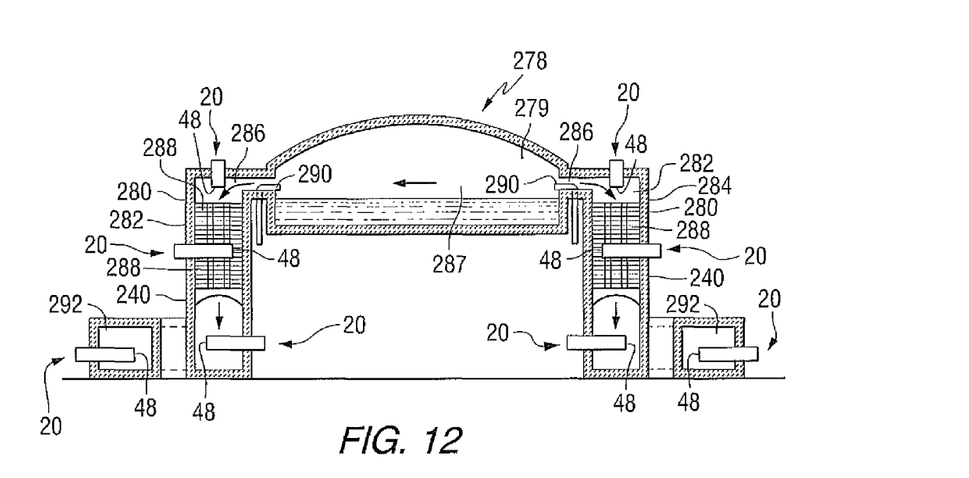
FIG. 12 is a schematic vertical section across the width of a cross-fired, regenerative furnace for melting glass batch materials and homogenizing molten glass, the furnace having devices of the invention mounted through the walls of the furnace.

With reference to FIG. 12, in one non-limiting embodiment of the invention, several devices 20 of the invention are inserted through selected portions of the walls of a regenerative type glass melting furnace 278 to be in the path of the exhaust gases from heating chamber 279, and in the path of heated combustion air moving into the heating chamber 279. Glass batch materials of the type used in the art to make float glass are melted in the heating chamber 279. As shown in FIG. 12, a plurality of the devices 20 of the invention are mounted through wall 280 of each one of a plurality of regenerators 282 on one side of the heating chamber 179, and the wall 280 of each one of a plurality of regenerators 284 on the opposite side of the heating chamber 279. FIG. 12 is similar to FIG. 1A of U.S. Pat. No. 4,256,173.

As is appreciated by those skilled in the art, the regenerators 282 and 284 go through a cycle including a firing period and a non-firing period. When the regenerators on one side of the heating chamber 279, e.g. the regenerators 282 are in their firing period, the regenerators 284 on the opposite side of the heating chamber 279, e.g. the regenerators 284 are in their non-firing period, and when the regenerators 282 are in their non-firing period, the regenerators 284 are in their firing period. During the non-firing period, heated exhaust gases from the heating chamber 279 moves through ports 286, through checkers 288 in the regenerators and out through the remaining part of the flue system of the regenerators in the non-firing period. As the exhaust gases move over the checkers 288, the checkers are heated and the exhaust gases are cooled.

During the firing period, combustion gas, e.g. air is moved through the regenerators, through the checkers 288 to heat the combustion gas, and through the ports 286. As the combustion gas moves through the ports 286, it mixes with fuel from the nozzles 290. The mixture is ignited and the flame directed into the heating chamber 279 toward the ports 286 of the regenerators in the non-firing period. The devices 20 of the invention as shown in FIG. 12, but not limiting to the invention, can be mounted in the ports 286, in the checkers, below the checkers and/or in the bypass flue 292 of the furnace 278. For a more detailed discussion of the operation of a regenerative furnace of the type shown in FIG. 12, reference can be made to U.S. Pat. No. 4,256,173, which patent is hereby incorporated by reference.

In the event the temperature of the exhaust gases moving past the devices during the non-firing cycle can thermally damage the device 20, the device can be removed from the regenerators during the non-firing cycle and inserted during the firing cycle. Depending on the location of the devices 20 in the furnace, the device 20 can be expected to be exposed to temperatures as high as 2800° F. (1538° C.).

Figure 13:
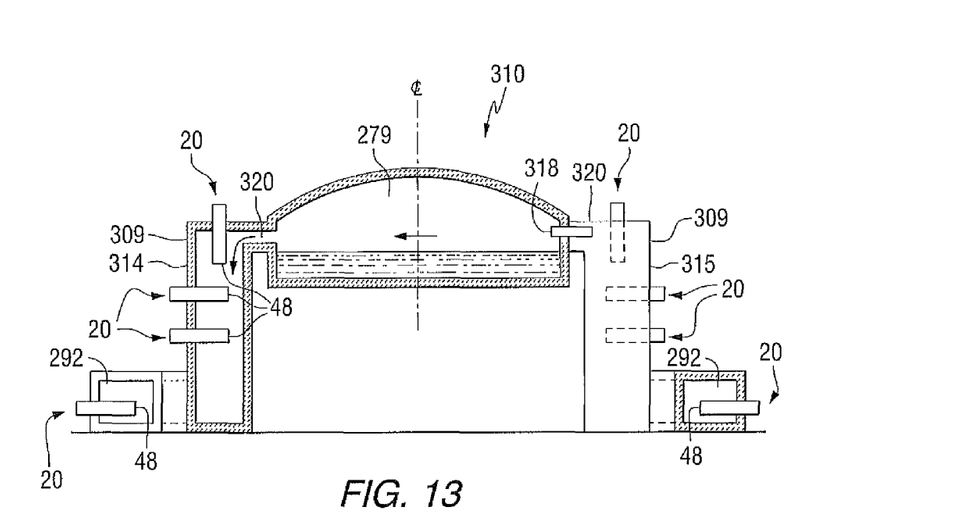
FIG. 13 is a schematic vertical step section across the width of an oxygen fired furnace for melting glass batch materials and homogenizing molten glass, the side to the left of the center line ("CL") in FIG. 13 is a cross section of the exhaust port and the side to the right of CL in FIG. 13 is a cross section of the furnace between the exhaust ports.

With reference to FIG. 13, in another embodiment of the invention, one or more devices 20 are mounted in walls 309 of an oxygen fired furnace 310 used to melt glass batch materials and homogenize molten glass. The oxygen-fired furnace 310 shown in FIG. 13 is a regenerative furnace, e.g. of the type shown in FIG. 12 modified to be an oxygen fired furnace, with the modifications of interest to this discussion including the absence of the checkers 288 from the regenerators 282 and 284 to provide exhaust flues 314 and 315 (absence of the checkers 288 from the regenerators 282 and 284 clearly shown for the exhaust flue 314 shown on the left side of FIG. 13), and mounting fuel nozzles 318 through the furnace wall at a position between ports 320 of the oxygen fired furnace as shown at the right side of FIG. 13. In the operation of the oxygen fired furnace 310, air and fuel are mixed and fired from the position of the nozzles 318 (only one shown in FIG. 13). The flame of the ignited mixture is directed into the heating chamber 279 of the furnace 310 to melt the glass batch materials and/or homogenize the molten glass. The exhaust from the heating chamber moves through the ports 320 at each side of the heating chamber 279 of the furnace 310 and simultaneously through both of the exhaust flues 314 and 315, and the secondary flues 48.

One or more of the devices 20 of the invention are mounted in the walls 309 of the furnace 310 as shown in FIG. 13. As the exhaust gases move past the devices 20, the outer member 24 of the device 20 is heated. As can be appreciated, the operation of the oxygen fired furnace 310 is a static process because there is no cycling between a firing period and a non-firing period. Further, the absence of the checkers 288, removes a heat sink providing more heat to heat the devices 20 of the invention.

Although the discussion was directed to mounting a device 20 of the invention into the heating system of a furnace, e.g. but not limited to a glass melting furnace, it can now be appreciated that several devices can be positioned at different locations in a furnace, and/or more than one device can be mounted at one general location in a furnace. Further, exhaust gases have particulates, which particulates can deposited on the outer surface the device 20. A layer of the particulates on the outer surface of the device can thermally insulate the outer member 24 from the heat of the exhaust gases. This problem can be managed by periodically removing the device and cleaning the outer surface to remove the particles, and/or periodically blowing air over the outer surface of the device 20 while mounted in the walls of the furnace to remove the particles.

The invention is not limited to the location in which the device 20 of the invention can be positioned in a furnace, e.g. but not limited to a regenerative furnace and/or an oxygen fired furnace. Further, as can now be appreciate, the invention is not limited to the manner in which the voltage generated is used. Uses of the voltage generated using the device 20 of the invention include, but are not limited to, powering lights, appliances and electrical equipment. Although the thermoelectric modules generate direct current, the direct current can be converted to alternating current, in any convenient manner to operate electrical equipment powered by alternating current.

Further the invention is not limited to the number of thermoelectric modules mounted in the chamber 25 of the device 20. For example and not limiting to the invention, one large thermoelectric module can be made, or several small modules can be used and joined together as discussed above and as shown in FIGS. 8 and 9.

As can be appreciated, the invention is not limited to the embodiments of the invention discussed herein, and the scope of the invention is only limited by the scope of the following claims.

What is claimed is:

1. A furnace having a device for thermoelectric generation, the furnace comprising a heating chamber, and a flue for moving heated exhaust gases from the heating chamber wherein the device is mounted in the flue to be heated by the exhaust gases moving over the device, the device comprising:

a first elongated member mounted within a hollow second elongated member to provide a compartment between outer surface of the first elongated member and inner surface of the second member;

at least one thermoelectric module mounted in the compartment and in contact with the outer surface of the first elongated member and the inner surface of the second member, and a passageway in the first elongated member wherein a temperature altering medium is moved through the passageway to alter the temperature of the first elongated member.

2. The furnace according to claim 1 wherein the first elongated member of the device is a conduit having a first end, an opposite second end, an outer surface and an inner surface, wherein the outer surface of the conduit is the outer surface of the first elongated member and is facing the compartment, and the inner surface of the conduit defines the passageway, and the device comprising:
- an end plate at the second end of the conduit, and
- a baffle within the passageway, the baffle extending from the first end toward the second end of the conduit and terminating short of the end plate to provide the passageway with a first passage extending from the first end to the second end, and a second passage extending from the second end to the first end, of the conduit, wherein the first and second passages are interconnected at the end plate.

3. The furnace according to claim 1 wherein the at least one thermoelectric module of the device comprises:
- a first plate in contact with the outer surface of the first elongated member;
- a second plate in contact with the inner surface of the second elongated member, and
- a thermoelectric cell between the first and the second plates wherein the thermoelectric cell generates a voltage when there is a temperature difference between the first plate and the second plate.

4. The furnace according to claim 3 wherein the first plate and the second plate of the device have at least one of the following relationships:
- a co-efficient of thermal expansion of the first plate is different from a co-efficient of thermal expansion of second plate;
- the thickness of the first plate and the second plate are different;
- the thickness of the first plate is greater than the thickness of the second plate;
- the thickness of the second plate is greater than thickness of the first plate;
- a co-efficient of thermal expansion of the first plate is greater than a co-efficient of thermal expansion of the second plate, and
- a co-efficient of thermal expansion of the second plate is greater than co-efficient of thermal expansion of the first plate,
wherein the thickness of the first and second plates is measured along a line extending from the outer surface of the first member to the inner surface of the second member.

5. The furnace according to claim 3, wherein the device comprises a biasing member to move at least one of the first and second plates toward its respective one of the outer surface of the first elongated member and the inner surface of the second elongated member.

6. The furnace according to claim 3 wherein the first plate of the device has a concave outer surface, the outer surface of the first elongated member of the device is a convex surface, the second plate of the device has a convex outer surface, the inner surface of the second elongated member of the device is a concave surface, and the device comprises a biasing member to move the convex surface of the second plate toward the concave surface of the second elongated member.

7. The furnace device, according to claim 1 wherein the second elongated member of the device comprises:
- a first conduit having a first end, an opposite second end, are outer surface and an inner surface;
- a: second conduit mounted in the first conduit, the second conduit having a first end, an opposite second end, an outer surface in facing relationship to the inner surface of the first conduit and an inner surface, wherein the inner surface of the second conduit is the inner surface of the second elongated member;
- a pair of spacers between the inner surface of the first conduit and the outer surface of the second conduit to provide the first passage and a second passage, wherein each of the first and second passages extend from the first end of the first and second conduits toward the second end of the first and second conduits, and the first and the second passages are interconnected at the second end of the second conduit to move a second temperature altering medium through the first and the second passages.

8. The furnace according to claim 1 wherein the second elongated member of the device comprises:
- a first conduit having a first end, an opposite second end, an outer surface and an inner surface;
- a second conduit mounted in the first conduit, the second conduit having a first end, an opposite second end, an outer surface in facing relationship to the inner surface of the first conduit and an inner surface, wherein the inner surface of the second conduit is the inner surface of the second elongated member, and
- a plurality of spacers between the inner surface of the first conduit and the outer surface of the second conduit to provide a first passage, a second passage, a third passage and a fourth passage, wherein each of the first, second, third and fourth passages extend from the first end of the first and second conduits toward the second end of the first and second conduits, and the first and the second passages are interconnected at the second end of the second conduit to move a second temperature altering medium from the first passage to the second passage, and the third and the fourth passages are interconnected at the second end of the second conduit to move a third temperature altering medium from the third passage to the fourth passage.

9. A furnace having a device for thermoelectric generation, the furnace comprising a heating chamber, and a flue for moving heated exhaust gases from the heating chamber wherein the device is mounted in the flue to be heated by the exhaust gases moving over the device, the device, comprising:
- a first elongated member mounted within a hollow second elongated member, wherein the second elongated member comprises;
- a first conduit having a first end, an opposite second end, an outer surface and an inner surface;
- a second conduit mounted in the first conduit, the second conduit having a first end, an opposite second end, an outer surface in facing relationship to the inner surface of the first conduit and an inner surface in facing relationship to outer surface of the first elongated member to provide a compartment between outer surface of the first elongated member and inner surface of the second conduit, and
- a pair of spacers between the inner surface of the first conduit and the outer surface of the second conduit to provide a first passageway and a second passageway, wherein each of the first and second passageways extend from the first end of the first and second conduits toward the second end of the first and second conduits, and the first and the second passageways are interconnected at the second end of the second conduit to move a temperature altering medium from the first passageway to the second passageway, and at least one thermoelectric module mounted in the compartment and in contact with the outer surface of the first elongated member and the inner surface of the second conduit of the second elongated member.

10. The furnace according to claim 9 wherein the first elongated member of the device is a hollow elongated member having a first end and an opposite second end, the device further comprising a baffle mounted in the first member and extending from the first end toward the second end of the first member to provide a third passageway and a fourth passageway, the third and the fourth passageways each extending from the first end of the first member to the second end of the first member, and the third and fourth passageways interconnected at the second end of the first member.

11. The furnace according to claim 9 wherein the at least one thermoelectric module comprises:
a first plate in contact with the outer surface of the first elongated member and a second plate in contact with the inner surface of the second conduit of the second elongated member, wherein the first plate and the second plate have at least one of the following relationships:
a co-efficient of thermal expansion of the first plate is different from coefficient of expansion of second plate;
the thickness of the first plate and the second plate are different;
the thickness of the first plate is greater than the thickness of the second plate;
the thickness of the second plate is greater than the thickness of the first plate;
a co-efficient of thermal expansion of the first plate is greater than a co-efficient of thermo expansion of the second plate, and
a co-efficient of thermal expansion of the second plate is greater than a co-efficient of thermal expansion of the first plate,
wherein the thickness of the first and second plates is measured along a line extending from the outer surface of the first member to the inner surface of the second member, and
a thermoelectric cell between the first and the second plates wherein the thermoelectric cell generates a voltage when there is a temperature difference between the first plate and the second plate.

12. The furnace according to claim 9 wherein the at least one thermoelectric module of the device comprising a first plate: a second plate; a thermoelectric cell between the first and the second plates wherein the thermoelectric cell generates a voltage when there is a temperature difference between and the first plate and the second plate, and a biasing member to move at least one of the first and second plates toward its respective one of the outer surface of the first elongated member and the inner surface of the second elongated member.

13. The furnace according to claim 9 wherein the pair of spacers of the device is a first pair of spacers and the device further comprising a second pair of spacers wherein the second pair of spacers is between the inner surface of the first conduit and the outer surface of the second conduit to provide, a third passageway and a fourth passageway, wherein each of the third and fourth passageways extend from the first end of the first and second conduits toward the second end of the first and second conduits, and are interconnected at the second end of the second conduit to move a second temperature altering medium from the third passageway to the fourth passageway.

14. A furnace having a device for thermoelectric generation, the furnace comprising a heating chamber, and a flue for moving heated exhaust gases from the heating chamber wherein the device is mounted in the flue to be heated by the exhaust gases moving over the device, the device comprising:
a first elongated member mounted within a hollow second elongated member to provide a compartment between outer surface of the first elongated member and inner surface of the second member, wherein the exhaust gas moves around outer surface of the second member;
at least one thermoelectric module mounted in the compartment and in contact with the outer surface of the first elongated member and the inner surface of the second member, and
a passageway in at least one of the first and second elongated members to move a temperature altering medium through the at least one of the first and second elongated members to alter the temperature of the at least one of the first and second elongated members.

15. The furnace according to claim 14 wherein the furnace is of the type selected from the group of a regenerative furnace, and an oxygen fired furnace, for melting batch materials.

16. The furnace according to claim 14 wherein the passageway is in the second elongated member and comprises first and second passages, and, the second elongated member comprises:
a first conduit having a first end, an opposite second end, an outer surface and an inner surface;
a second conduit mounted in the first conduit, the second conduit having a first end, an opposite second end, an outer surface in facing relationship to the inner surface of the first conduit and an inner surface, wherein the inner surface of the second conduit is the inner surface of the second elongated member;
a pair of spacers between the inner surface of the first conduit and the outer surface of the second conduit to provide the first and second passages, wherein each of the first and second passages extend from the first end of the first and second conduits toward the second end of the first and second conduits, and the first and the second passages are interconnected at the second end of the second conduit to move the temperature altering medium from the first passage to the second passage.

17. The furnace according to claim 14 wherein the passageway is in the first elongated member and comprises first and second passages, and the first elongated member is a hollow elongated member having a first end, an opposite second end and a baffle mounted in the hollow first elongated member and extending from the first end toward the second end of the first elongated member to provide the first and second passages, the first and the second passages each extending from the first end of the first elongated member to the second end of the first elongated member, and are interconnected at the second end of the first elongated member.

18. The furnace according to claim 14 wherein the at least one thermoelectric module comprises:
a first plate in surface contact with the outer surface of the first elongated member and a second plate in surface contact with inner surface of the second elongated member, and
a thermoelectric cell between the first and the second plates wherein the thermoelectric cell generates a voltage when there is a temperature difference between the first plate and the second plate, wherein
the first plate and the second plate have at least one of the following relationships:

a co-efficient of thermal expansion of the first plate is different from a co-efficient of thermal expansion of and the second plate;
the thickness of the t plate and the second plate are different;
the thickness of the first plate is greater than the thickness of the second plate;
the thickness of the second plate greater than the thickness of the first plate;
a co-efficient of thermal expansion of the first plate is greater than a co-efficient of thermal expansion of the second plate, and
a co-efficient of thermal expansion of the second plate is greater than a co-efficient of thermal expansion of the first plate,
wherein the thickness of the first and second plates is measured along a line extending from the outer surface of the first member to the inner surface of the second member.

19. The furnace according claim 14 wherein the at least one thermoelectric module comprises:

a first plate in surface contact with the outer surface of the first elongated member and a second plate in surface contact with inner surface of the second elongated member, and a thermoelectric cell between the first and the second plates wherein the thermoelectric cell generates a voltage when there is a temperature difference between the first plate and the second plate, and a biasing member to move at least one of the first and second plates toward its respective one of the outer surface of the first elongated member and the inner surface of the second elongated member.

20. The furnace according to claim 19 wherein the first plate has a concave outer surface, the outer surface of the first elongated member is a convex surface, the second plate has a convex outer surface, the inner surface of the second elongated member is a concave surface, and the biasing member moves the convex surface of the second plate toward the concave surface of the second elongated member.

* * * * *